United States Patent
Arai

(10) Patent No.: US 9,466,784 B2
(45) Date of Patent: Oct. 11, 2016

(54) SEMICONDUCTOR DEVICE HAVING MULTIPLE MAGNETIC SHIELD MEMBERS

(71) Applicant: SHINKO ELECTRIC INDUSTRIES CO., LTD., Nagano-shi, Nagano (JP)

(72) Inventor: Tadashi Arai, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 14/870,084

(22) Filed: Sep. 30, 2015

(65) Prior Publication Data

US 2016/0093796 A1 Mar. 31, 2016

(30) Foreign Application Priority Data

Sep. 30, 2014 (JP) ................................ 2014-201766

(51) Int. Cl.
*H01L 43/02* (2006.01)
*H01L 27/22* (2006.01)

(52) U.S. Cl.
CPC ............ *H01L 43/02* (2013.01); *H01L 27/222* (2013.01)

(58) Field of Classification Search
CPC ...................................................... H01L 43/02
See application file for complete search history.

(56) References Cited

U.S. PATENT DOCUMENTS

| | | | | |
|---|---|---|---|---|
| 7,592,639 B2 * | 9/2009 | Maeda | ................ | C09K 11/025 257/100 |
| 7,642,633 B2 * | 1/2010 | Hirose | ................... | H01L 24/49 257/685 |
| 7,829,980 B2 * | 11/2010 | Molla | ...................... | G11C 5/02 257/659 |
| 8,466,539 B2 * | 6/2013 | Li | .......................... | H01L 23/552 257/422 |
| 8,652,880 B2 * | 2/2014 | Bando | ............... | H01L 23/49503 257/659 |
| 9,324,663 B2 * | 4/2016 | Watanabe | ............... | H01L 23/13 |
| 2003/0062420 A1 * | 4/2003 | Ohta | ................ | G06K 19/07728 235/492 |
| 2004/0232536 A1 * | 11/2004 | Fukuzumi | ............. | H01L 23/057 257/684 |
| 2005/0233178 A1 * | 10/2005 | Sugimoto | .............. | G11B 5/667 428/839 |
| 2006/0180880 A1 * | 8/2006 | Wang | .................... | H01L 23/552 257/414 |
| 2011/0298111 A1 * | 12/2011 | Kim | ....................... | H01L 21/561 257/660 |
| 2011/0312108 A1 * | 12/2011 | Onodera | ............... | H01L 21/568 438/15 |
| 2012/0018858 A1 * | 1/2012 | Chen | ..................... | H01L 21/565 257/659 |
| 2012/0119338 A1 * | 5/2012 | Watanabe | ............... | H01L 23/13 257/659 |
| 2013/0002042 A1 * | 1/2013 | Hatase | .................. | H01F 27/327 307/104 |
| 2013/0256819 A1 * | 10/2013 | Watanabe | ............... | H01L 43/02 257/422 |
| 2015/0243607 A1 * | 8/2015 | Jang | ...................... | H01L 23/564 438/113 |

FOREIGN PATENT DOCUMENTS

JP 2013-207059 10/2013

OTHER PUBLICATIONS

This application is co-pending with U.S. Appl. No. 14/870,078, which was filed in the United States Patent and Trademark Office on Sep. 30, 2015.

* cited by examiner

*Primary Examiner* — Ida M Soward
(74) *Attorney, Agent, or Firm* — Rankin, Hill & Clark LLP

(57) ABSTRACT

A semiconductor device includes a wiring substrate, a lower magnetic shield member, a semiconductor chip, and an upper magnetic shield member. The lower magnetic shield member is provided on the wiring substrate. The semiconductor chip is provided on the lower magnetic shield member. The semiconductor chip includes a magnetic memory element. The upper magnetic shield member is provided over the semiconductor chip. The semiconductor chip is disposed between the upper magnetic shield member and the lower magnetic shield member. The lower magnetic shield member and the upper magnetic shield member are in direct contact with each other.

29 Claims, 14 Drawing Sheets

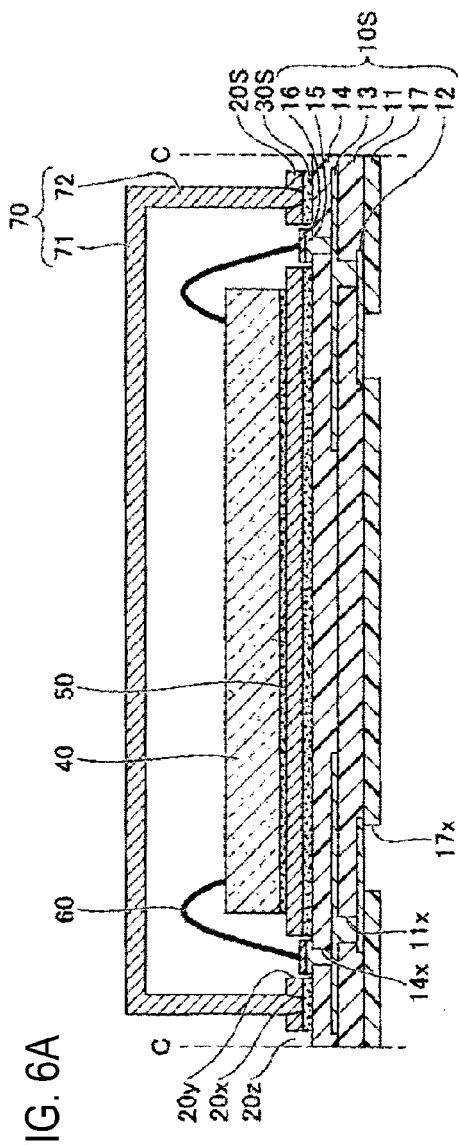
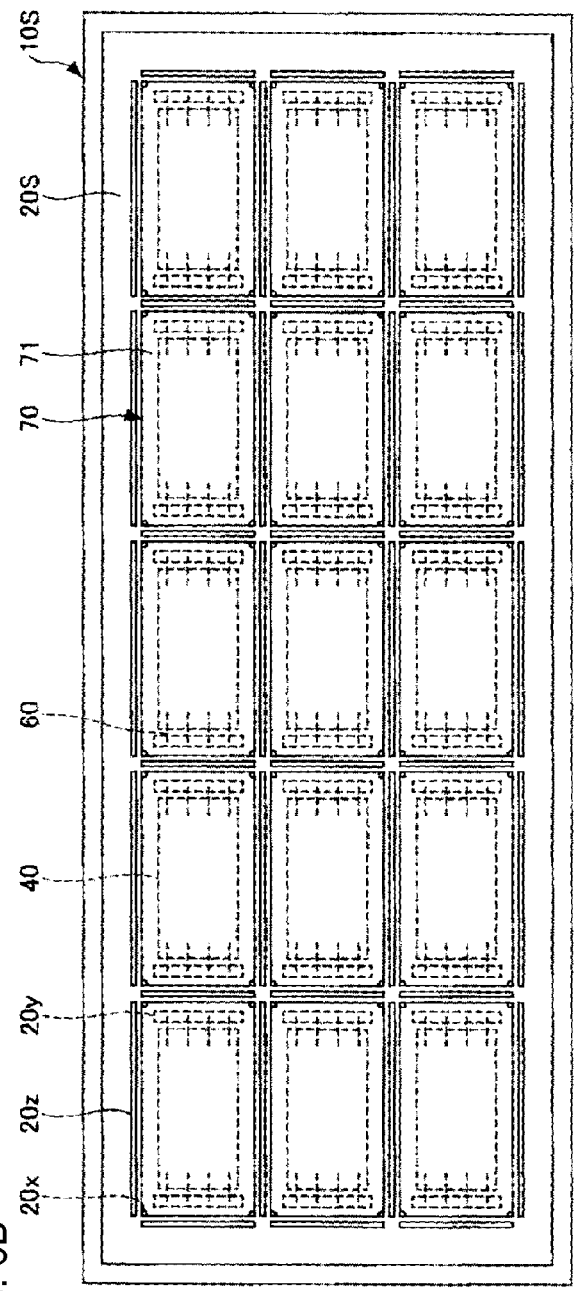
FIG. 6A
FIG. 6B

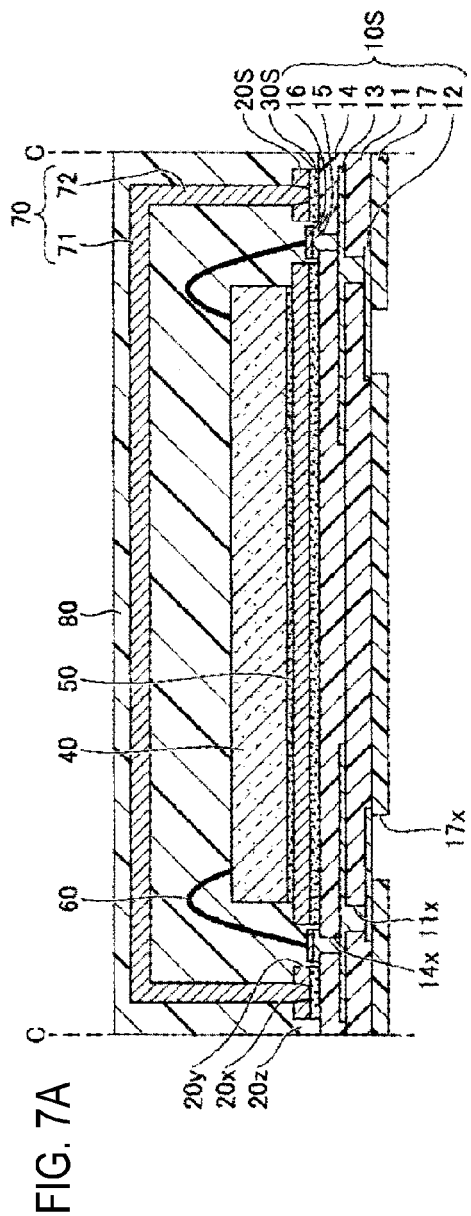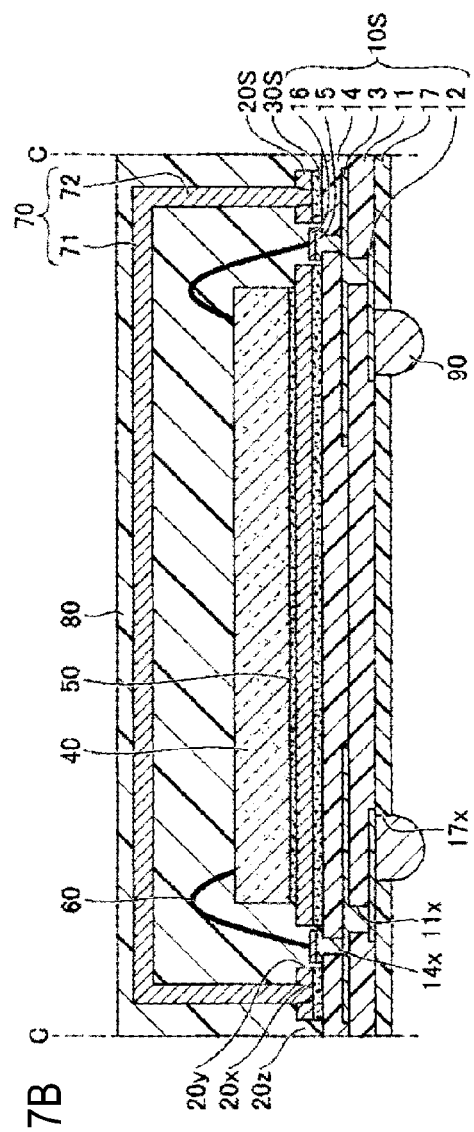

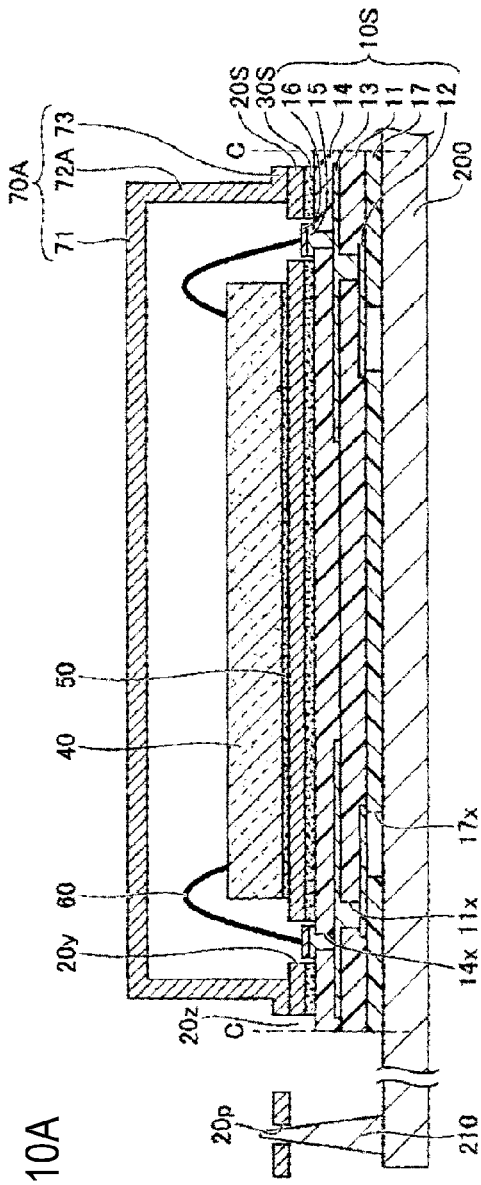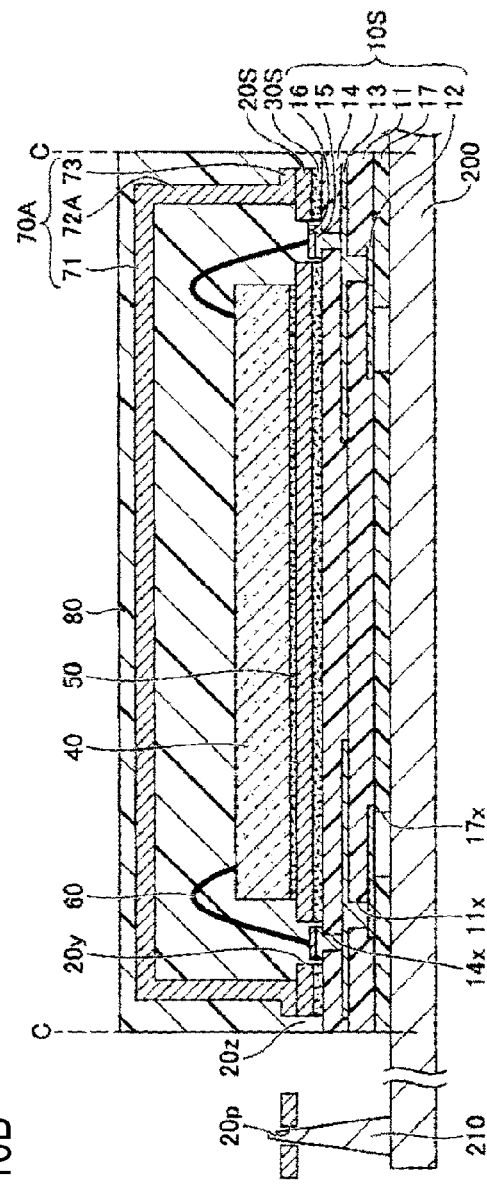
FIG. 10A
FIG. 10B

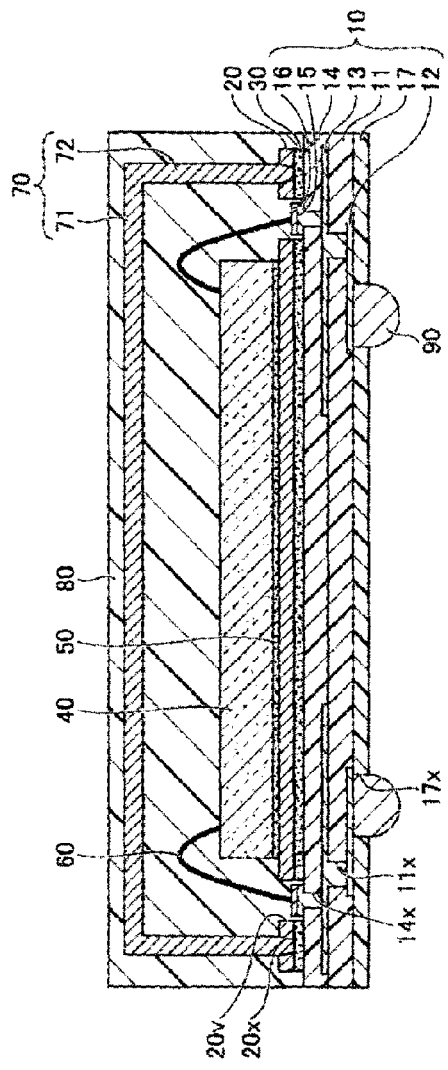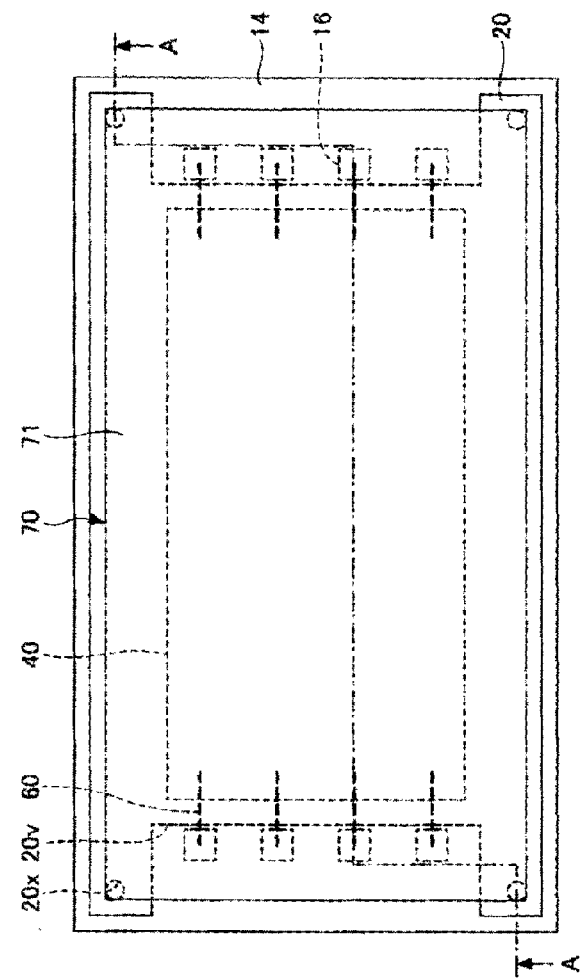
FIG. 11A
FIG. 11B

SEMICONDUCTOR DEVICE HAVING MULTIPLE MAGNETIC SHIELD MEMBERS

CROSS-REFERENCE TO RELATED APPLICATION(S)

This application claims priority from Japanese Patent Application No. 2014-201766, filed on Sep. 30, 2014, the entire contents of which are herein incorporated by reference.

BACKGROUND

1. Field

Exemplary embodiments of the invention relate to a semiconductor device and a method for manufacturing the same.

2. Related Art

In recent years, much attention has been paid to MRAMs (Magnetoresistive Random Access Memories), which are nonvolatile memories. Differently from DRAMs (Dynamic Random Access Memories) or SRAMs (Static Random Access Memories), which are volatile memories, MRAMs can hold content even if a current is not applied thereto. Accordingly, the rise time after power-on is short. In addition, since MRAMs can be set normally OFF, power consumption can be reduced drastically as compared with DRAMs or SRAMs.

MRAMs have excellent properties thus. However, MRAMs cannot operate without a magnetic shield that prevents an external magnetic field from affecting an element (a semiconductor chip).

As an example of the package of an MRAM provided with a magnetic shield member, for example, the following structure has been proposed. That is, a first magnetic shield member and a second magnetic shield member are disposed so that an element is disposed therebetween, and the first magnetic shield member and the second magnetic shield member are connected through a resin (for example, see JP 2013-207059 A).

SUMMARY

Generally, however, the magnetic permeability of a resin is lower than that of a magnetic shield member. Therefore, when a resin is put between the first magnetic shield member and the second magnetic shield member, the flow of magnetism is blocked in the resin portion. As a result, an external magnetic field cannot be suppressed from affecting the element.

Exemplary embodiments of the invention have been made in view of the above circumstances. Some exemplary embodiments of the invention provide a semiconductor device or the like that can suppress an external magnetic field from affecting an element of the semiconductor device.

According to one exemplary embodiment, a semiconductor device includes a wiring substrate, a lower magnetic shield member, a semiconductor chip, and an upper magnetic shield member. The lower magnetic shield member is provided on the wiring substrate. The semiconductor chip is provided on the lower magnetic shield member. The semiconductor chip includes a magnetic memory element. The upper magnetic shield member is provided over the semiconductor chip. The semiconductor chip is disposed between the upper magnetic shield member and the lower magnetic shield member. The lower magnetic shield member and the upper magnetic shield member are in direct contact with each other.

With the disclosed technique, it is possible to provide a semiconductor device or the like that can suppress an external magnetic field from affecting elements of the semiconductor device or the like.

BRIEF DESCRIPTION OF THE DRAWINGS

FIGS. 6A and 6B are views (part 5) showing the process for manufacturing the semiconductor device according to the first exemplary embodiment;

FIGS. 7A and 7B are views (part 6) showing the process for manufacturing the semiconductor device according to the first exemplary embodiment;

FIGS. 10A and 10B are views (part 2) showing the process for manufacturing the semiconductor device according to the second exemplary embodiment;

FIGS. 11A and 11B are views showing a semiconductor device according to Modification 1 of the first exemplary embodiment;

DETAILED DESCRIPTION

Figure 1A:
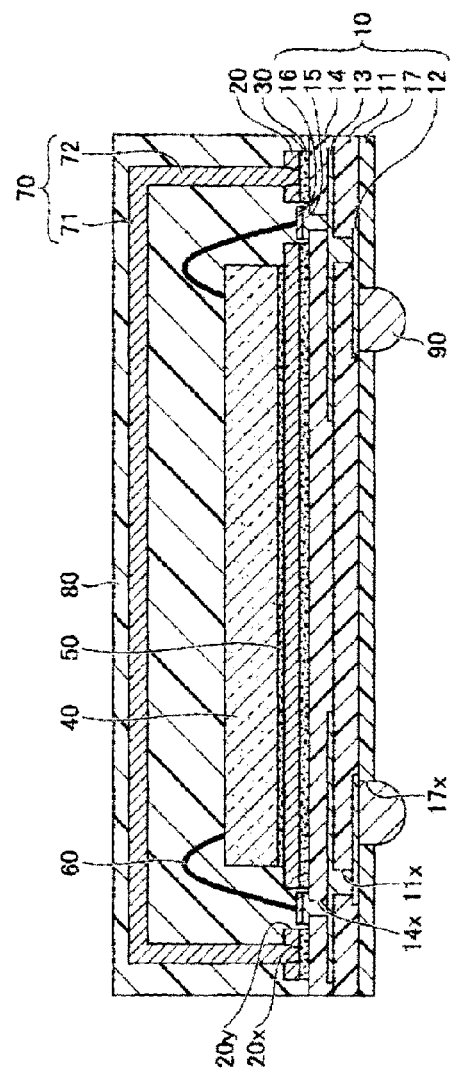
FIGS. 1A and 1B show a semiconductor device according to a first exemplary embodiment.

Exemplary embodiments of the invention will be described below with reference to the accompanying drawings. It is noted that in the drawings, the same reference signs will be used to indicate same or similar constituent components and that redundant description thereon may be omitted.

<First Exemplary Embodiment>

[Structure of Semiconductor Device According to First Exemplary Embodiment]

Figure 1B:
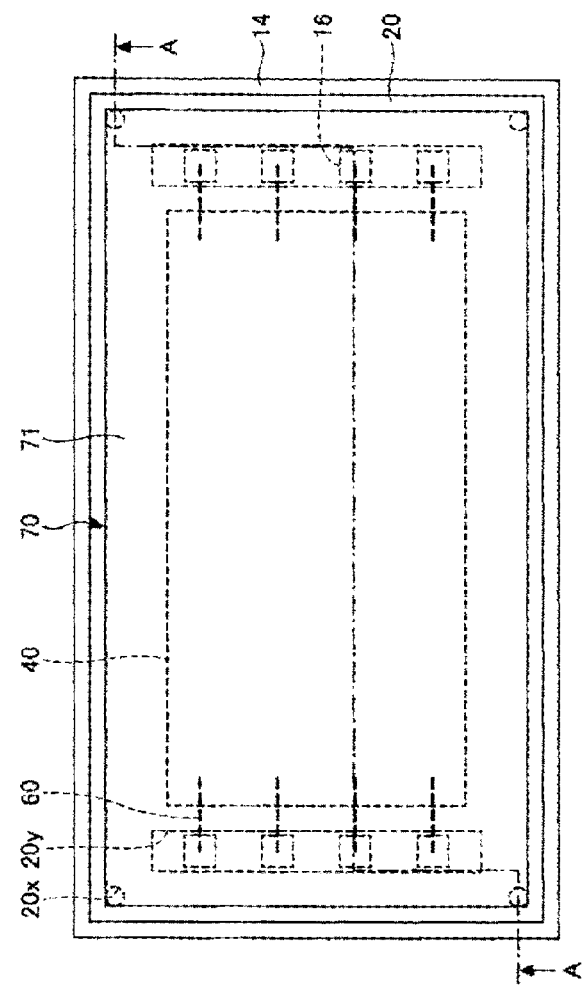

First, the structure of a semiconductor device according to a first exemplary embodiment will be described. FIGS. 1A and 1B show the semiconductor device according to the first exemplary embodiment. FIG. 1B is a plan view. FIG. 1A is a sectional view taken on a line A-A in FIG. 1B. In FIG. 1B, a mold resin 80 is not shown.

Referring to FIGS. 1A and 1B, the semiconductor device 1 has a wiring substrate 10, a lower magnetic shield member 20, an adhesive layer 30, a semiconductor chip 40, an adhesive layer 50, bonding wires 60, an upper magnetic shield member 70 and a mold resin 80.

For the sake of convenience, a circuit formation surface side of the semiconductor chip 40 in the semiconductor device 1 will be referred to as an "upper side" or "one side," and a solder resist layer 17 side will be referred to as a "lower side" or "the other side." Also, a surface of each component on the circuit formation surface side of the semiconductor chip 40 will be referred to as "one surface" or an "upper surface," and a surface on the solder resist layer 17 side will be referred to as "the other surface" or a "lower surface." The semiconductor device 1 may be used upside down or may be disposed at a desired angle. Furthermore, a "plan view" means a view of an object observed from a normal direction of the circuit formation surface of the semiconductor chip 40, and a "planar shape" means a shape of the object observed from the normal direction of the circuit formation surface of the semiconductor chip 40.

In the wiring substrate 10, an insulating layer 11 is, for example, made of a thermosetting epoxy resin, a polyimide resin or the like. A wiring layer 12 that is, for example, made of copper (Cu) is embedded on the lower surface side of the insulating layer 11. A lower surface of the wiring layer 12 is exposed from the lower surface of the insulating layer 11. An upper surface and side surfaces of the wiring layer 12 are covered by the insulating layer 11. The lower surface of the wiring layer 12 may be, for example, flush with the lower surface of the insulating layer 11.

A wiring layer 13 that is, for example, made of copper (Cu) is formed on an upper surface side of the insulating layer 11. The wiring layer 13 includes via wirings and a wiring pattern. Each via wiring is filled in a via hole 11x that penetrates the insulating layer 11 so as to expose the upper surface of the wiring layer 12. The wiring layer 13 is electrically connected to the wiring layer 12.

An insulating layer 14 is, for example, made of a thermosetting epoxy resin, a polyimide resin or the like. The insulating layer 14 is formed on the insulating layer 11 so as to cover the wiring layer 13. Pads 15 that are, for example, made of copper (Cu) are formed on an upper surface of the insulating layer 14. The pads 15 are integrated with via wirings. Each via wiring is filled in a via hole 14x that penetrates the insulating layer 14 so as to expose an upper surface of the wiring layer 13. The pads 15 are electrically connected to the wiring layer 13

A surface treated layer 16 is formed on an upper surface of each pad 15. Examples of the surface treated layer 16 include an Au layer, a Ni/Au (a metal layer in which a Ni layer and an Au layer are stacked in this order), a Ni/Pd/Au layer (a metal layer in which a Ni layer, a Pd layer and an Au layer are stacked in this order), etc.

A solder resist layer formed with opening portions for exposing the pads 15 on which the surface treated layer 16 is formed may be provided on the upper surface of the insulating layer 14. In this case, the lower magnetic shield member 20 is provided on the solder resist layer through the adhesive layer 30.

The solder resist layer 17 is made of a photosensitive insulating resin or the like. The photosensitive insulating resin contains a phenolic resin, a polyimide resin or the like as its main component. The solder resist layer 17 is formed on the lower surface of the insulating layer 11. The solder resist layer 17 is formed with opening portions 17x. The lower surface of the wiring layer 12 is exposed to the opening portions 17x. For example, a solder bump 90 (which is an example of an external connection terminal) may be formed on the lower surface of the wiring layer 12 exposed to each opening portion 17x.

The lower magnetic shield member 20 is provided on the wiring substrate 10. More specifically, the lower magnetic shield member 20 is bonded through the adhesive layer 30 to the upper surface of the insulating layer 14 which is the outermost surface on the one side of the wiring substrate 10. The lower magnetic shield member 20 has a thickness, for example, in a range of about 50 μm to about 100 μm.

Metals may be used as the material of the lower magnetic shield member 20. Among metals, it is preferable that a soft magnetic material having high magnetic permeability and high saturated magnetic flux density is used to improve the flow of magnetism. It is preferable that the magnetic permeability is in a range of about 1,000 to about 10,000. It is preferable that the saturated magnetic flux density is in a range of about 0.5 (T) to about 1.5 (T). Examples of the soft magnetic materials having such properties include Fe—Ni based alloys such as permalloy, 42 alloy, 46 alloy, and 52 alloy.

Also, it is preferable that, among the soft magnetic materials having such properties, a material having a thermal expansion coefficient that is close to a thermal expansion coefficient of a major material (e.g. silicon) constituting the semiconductor chip 40 is selected as the material of the lower magnetic shield member 20. This configuration suppresses the semiconductor device 1 from being warped.

The lower magnetic field member 20 is formed with opening portions 20x and 20y. The opening portions 20x are holes for exposing the upper surface of the adhesive layer 30. For example, the opening portions 20x are provided near the four corners of the lower magnetic shield member 20. The planar shape of each opening portion 20x may be a desired shape such as a circle or a rectangle, so long as a leg portion 72 of the upper magnetic shield member 70 can be press-fitted into the opening portion 20x.

The opening portions 20y are holes for exposing the pads 15 on which the surface treated layer 16 is formed. The opening portions 20y are provided on both sides of the semiconductor chip 40 to be across the semiconductor chip 40. It is noted that the adhesive layer 30 is not formed in the sites of the opening portions 20y. Also, since there is a gap between the inner wall of each opening portion 20y and the corresponding pad(s) 15, the inner wall of each opening portion 20y and the corresponding pad(s) 15 are not in contact with each other. Furthermore, since there is a gap between the inner wall of each opening portion 20y and the corresponding surface treated layer(s) 16, the inner wall of each opening portion 20y and the corresponding surface treated layer(s) 16 are not in contact with each other. The planar shape of each opening portion 20y is, for example, a rectangular shape so that a plurality of pads 15 are arranged in and exposed to each opening portion 20y. Alternatively, the planar shape of the opening portion 20y may be any other shape than the rectangular shape.

The semiconductor chip 40 is mounted on the lower magnetic shield member 20 through the adhesive layer 50 in a face-up manner so that a circuit formation surface where electrode pads are formed faces a top plate 71 of the upper magnetic shield member 70. The semiconductor chip 40 is disposed between the opposed opening portions 20y on the upper surface of the lower magnetic shield member 20. The semiconductor chip 40 is, for example, a memory chip (MRAM) in which a magnetic memory element is formed in silicon. A logic circuit or the like may be mounted in the semiconductor chip 40. Each electrode pad of the semiconductor chip 40 is electrically connected through a bonding wire 60 to the surface treated layer 16 on the pad 15 exposed to the opening portion 20$y$. A metal wire such as a gold wire or a copper wire may be used as the bonding wire 60.

The upper magnetic shield member 70 is provided on the lower magnetic shield member 20 so that the semiconductor chip 40 is disposed between the upper magnetic shield member 70 and the lower magnetic shield member 20. More specifically, the upper magnetic shield member 70 includes the top plate 71 and the leg portions 72 (see also FIG. 5 which will be described later). The top plate 71 faces the lower magnetic shield member 20 so that the semiconductor chip 40 is disposed between the top plate 71 and the lower magnetic shield member 20. The leg portions 72 are formed to extend toward the lower magnetic shield member 20 from plural positions (for example, the four corners) in an outer edge portion of the top plate 71.

The leg portions 72 are used to fix the upper magnetic shield member 70 to the lower magnetic shield member 20. Also, the leg portions 72 define a distance between the upper magnetic shield member 70 and the lower magnetic shield member 20. A lower end portion of each leg portion 72 is press-fitted into the corresponding opening portion 20$x$ of the lower magnetic shield member 20 so that the leg portion 72 is in direct contact with the lower magnetic shield member 20. That is, the upper magnetic shield member 70 and the lower magnetic shield member 20 are in direct contact with each other without intervention of a resin or the like.

The upper magnetic shield member 70 may have a thickness, for example, in a range of about 50 μm to about 100 μm. Metals may be used as the material of the upper magnetic shield member 70. It is preferable that a soft magnetic material is used in the same manner as the lower magnetic shield member 20. Also, in view of improvement in the flow of magnetism, it is preferable that the magnetic permeability and the saturated magnetic flux density of the upper magnetic shield member 70 are substantially equal to those of the lower magnetic shield member 20. It is noted that the upper magnetic shield member 70 has a shape so as not to be in contact with the semiconductor chip 40 and each bonding wire 60. The planar shapes of the lower magnetic shield member 20 and the upper magnetic shield member 70 are, for example, a rectangle so as to cover the semiconductor chip 40.

The mold resin 80 is provided on the wiring substrate 10 so as to cover the lower magnetic shield member 20, the semiconductor chip 40 and the upper magnetic shield member 70. For example, an epoxy resin or the like containing fillers such as silica may be used as the mold resin 80. It is noted that the mold resin 80 may be provided to expose the upper surface of the top plate 71 of the upper magnetic shield member 70.

[Method for Manufacturing Semiconductor Device According to First Exemplary Embodiment]

Figure 2A:
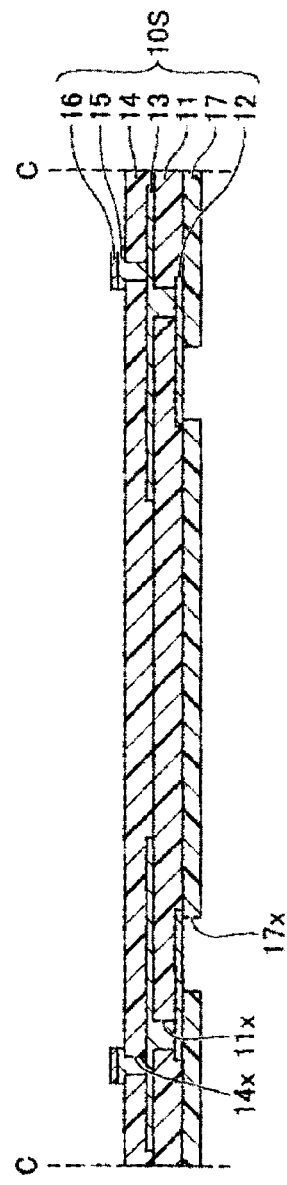
FIGS. 2A and 2B are views (part 1) showing a process for manufacturing the semiconductor device according to the first exemplary embodiment.
Figure 2B:
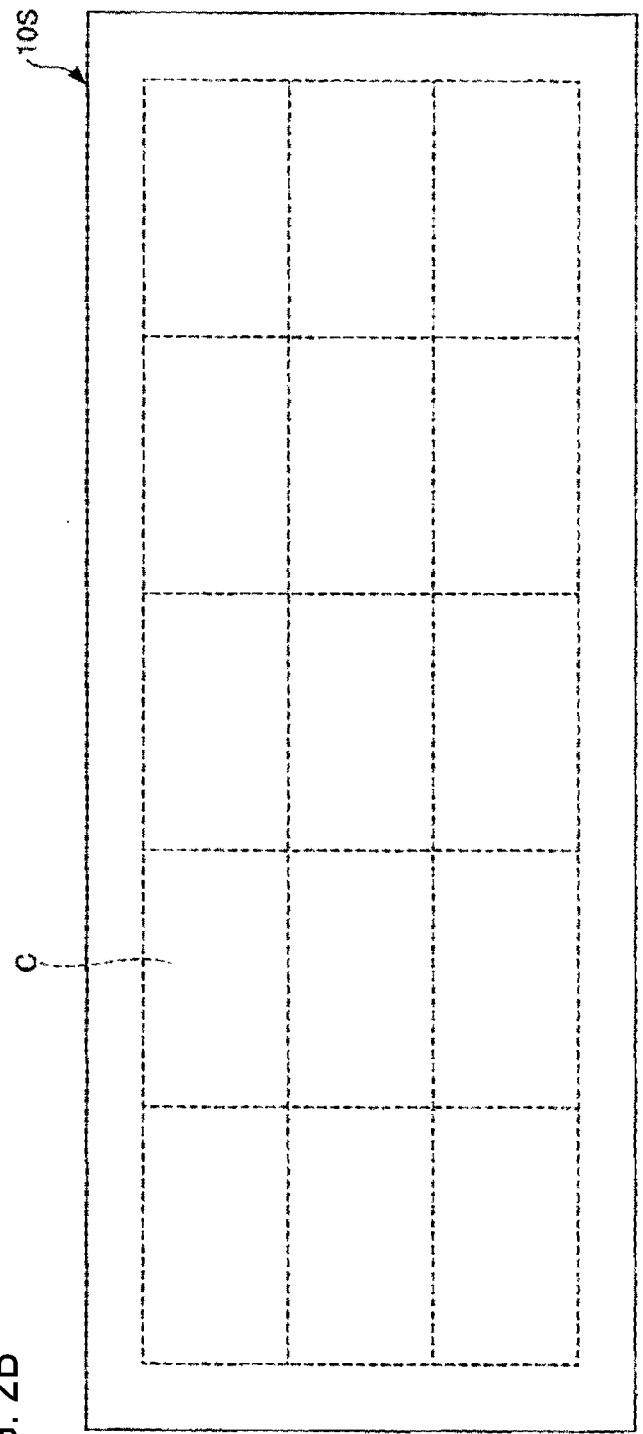

Next, a method for manufacturing the semiconductor device according to the first exemplary embodiment will be described. FIG. 2A to FIG. 7B are views showing a process for manufacturing the semiconductor device according to the first exemplary embodiment. First, in a step shown in FIGS. 2A and 2B, a sheet-like wiring substrate 10S is prepared. The wiring substrate 10S has a plurality of regions C, which will be divided into respective wiring substrates 10. FIG. 2B is a plan view. FIG. 2A is a sectional view showing one of the regions C enclosed by the broken lines in FIG. 2B. It is noted that the fundamental structure of the wiring substrate 10S is similar to the wiring substrate 10 described above. Also, the wiring substrate 10S may be produced by a well-known buildup method. However, another wiring substrate produced by another method and having a different layer structure or the like may be used.

Figure 3A:
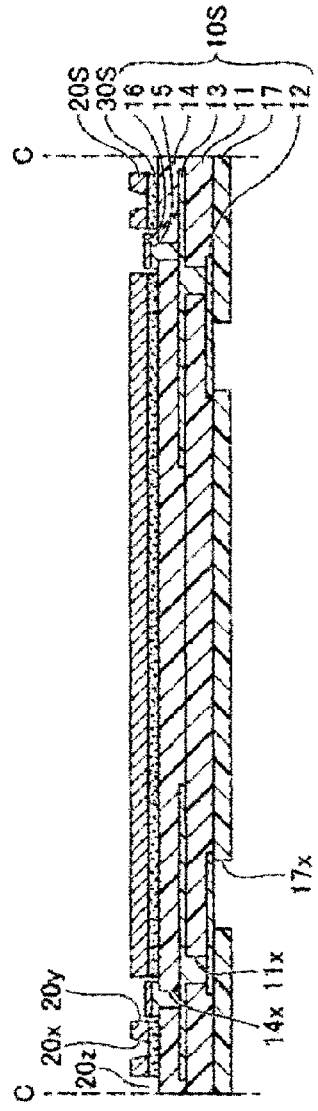
FIGS. 3A and 3B are views (part 2) showing the process for manufacturing the semiconductor device according to the first exemplary embodiment.
Figure 3B:
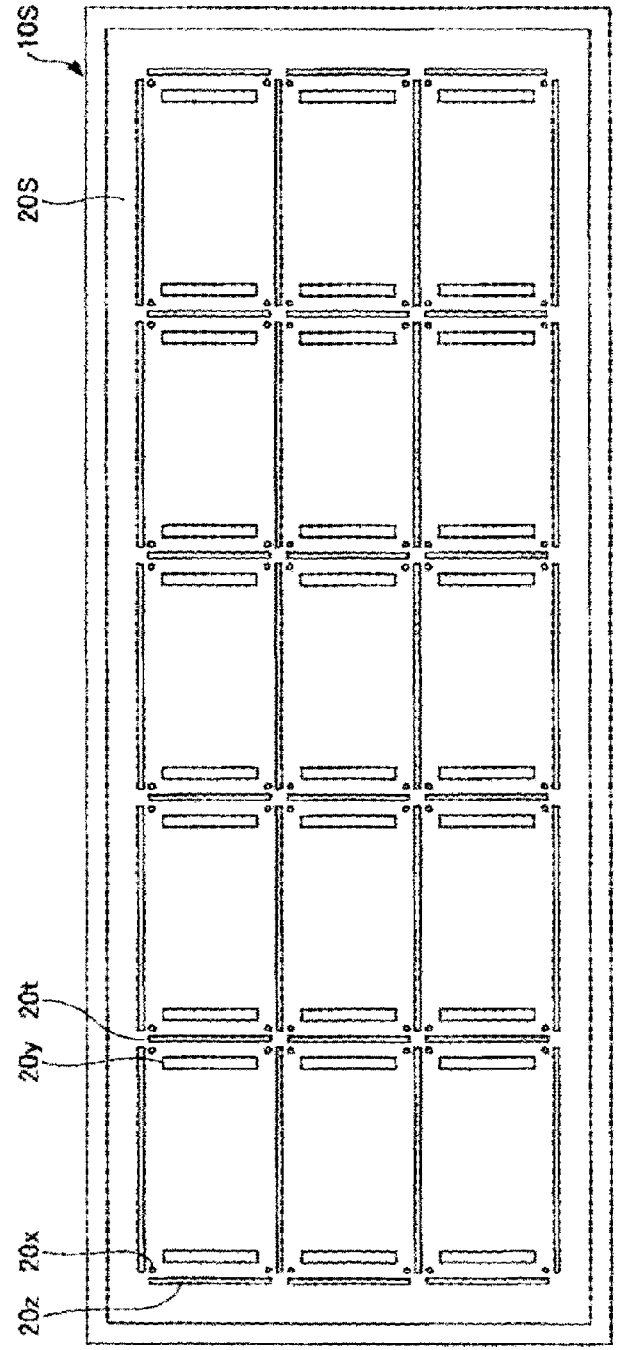

Next, in a step shown in FIGS. 3A and 3B, a sheet-like lower magnetic shield member 20S is bonded to an upper surface of the sheet-like wiring substrate 10S through a sheet-like adhesive layer 30S. The sheet-like adhesive layer 30S may be a die attach film. The sheet-like lower magnetic shield member 20S has a plurality of regions, which will be divided into respective lower magnetic shield members 20. The die attach film is, for example, made of a resin such as an epoxy resin. FIG. 3B is a plan view. FIG. 3A is a sectional view showing one of the regions enclosed by slits 20$z$ in FIG. 3B.

More specifically, the sheet-like lower magnetic shield member 20S is prepared. The opening portions 20$x$ and 20$y$ are formed in the sheet-like lower magnetic shield member 20S. The plurality of slits 20$z$ defining the regions which will become the lower magnetic shield members 20 are formed so as to facilitate the segmentation. It is noted that each opening portion 20$x$ is slightly smaller in size than the lower end portion of each leg portion 72 so that the lower end portion of the leg portion 72 is press-fitted into each opening portion 20$x$. Also, the slits 20$z$ are formed in positions corresponding to the broken lines indicating the regions C in FIG. 2B.

Also, in the sheet-like lower magnetic shield member 20S, the slits 20$z$ are not formed in the four corner portions of each region which will be the lower magnetic shield member 20, but suspending portions 20$t$ are formed there. The regions which will become the lower magnetic shield members 20 are connected to each other by the suspending portions 20$t$. The sheet-like lower magnetic shield member 20S is made of a metal such as a Fe—Ni based alloy. Therefore, the opening portions 20$x$ and 20$y$ and the slits 20$z$ can be formed easily by press working with a die. However, the opening portions 20$x$ and 20$y$ and the slits 20$z$ may be formed by etching.

After the opening portions 20$x$ and 20$y$ and the slits 20$z$ are formed, the sheet-like adhesive layer 30S formed with openings corresponding to the opening portions 20$y$ and the slits 20$z$ is pasted to the lower surface of the sheet-like lower magnetic shield member 20S. Then, the sheet-like adhesive layer 30S and the sheet-like lower magnetic shield member 20S are bonded to the upper surface of the sheet-like wiring substrate 10S. Alternatively, the sheet-like adhesive layer 30S formed with openings corresponding to the opening portions 20$y$ and the slits 20$z$ is pasted to the upper surface of the sheet-like wiring substrate 10S in advance. Then, the sheet-like lower magnetic shield member 20S formed with the opening portions 20$x$ and 20$y$ and the slits 20$z$ may be bonded onto the sheet-like adhesive layer 30S.

Figure 4A:
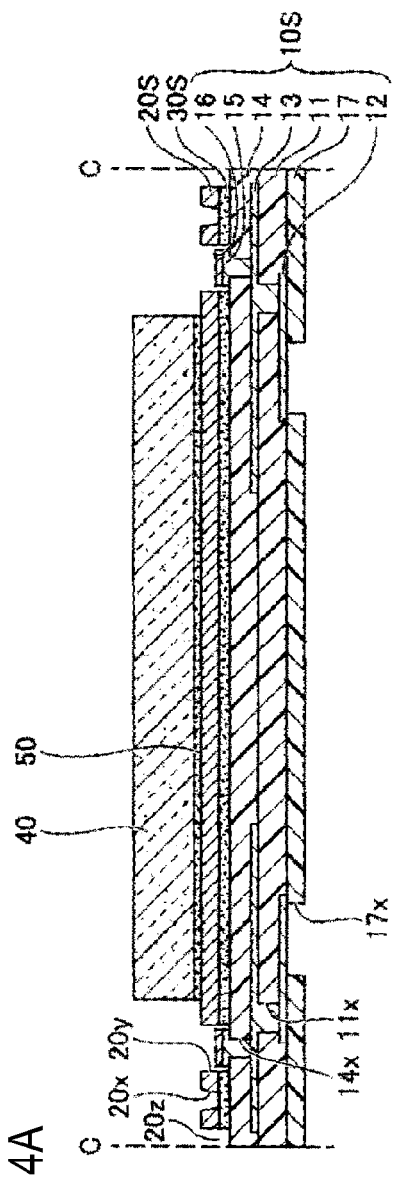
FIGS. 4A and 4B are views (part 3) showing the process for manufacturing the semiconductor device according to the first exemplary embodiment.
Figure 4B:
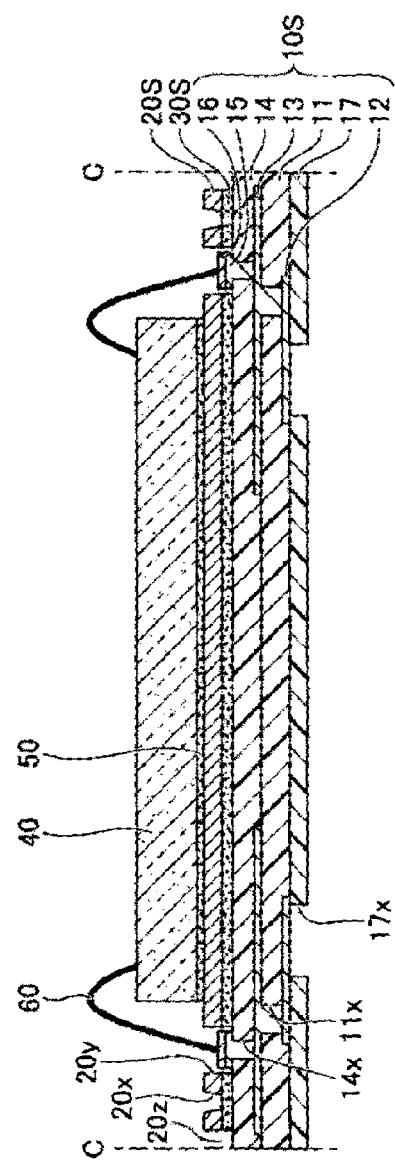

Next, in a step shown in FIG. 4A, a semiconductor chip 40 is mounted in a face-up manner on the upper surface of each of the regions, which will be singulated and become the lower magnetic shield member 20, through an adhesive layer 50 made of the die attach film or the like. The adhesive layer 50 may be made of, for example, an epoxy resin. Then, in a step shown in FIG. 4B, electrode pads formed in the circuit formation surface of the semiconductor chip 40 are respectively connected to the surface treated layers 16 on the pads 15 exposed to the opening portions 20$y$, through bonding wires 60. FIGS. 4A and 4B are section views corresponding to FIG. 3A.

Figure 5:
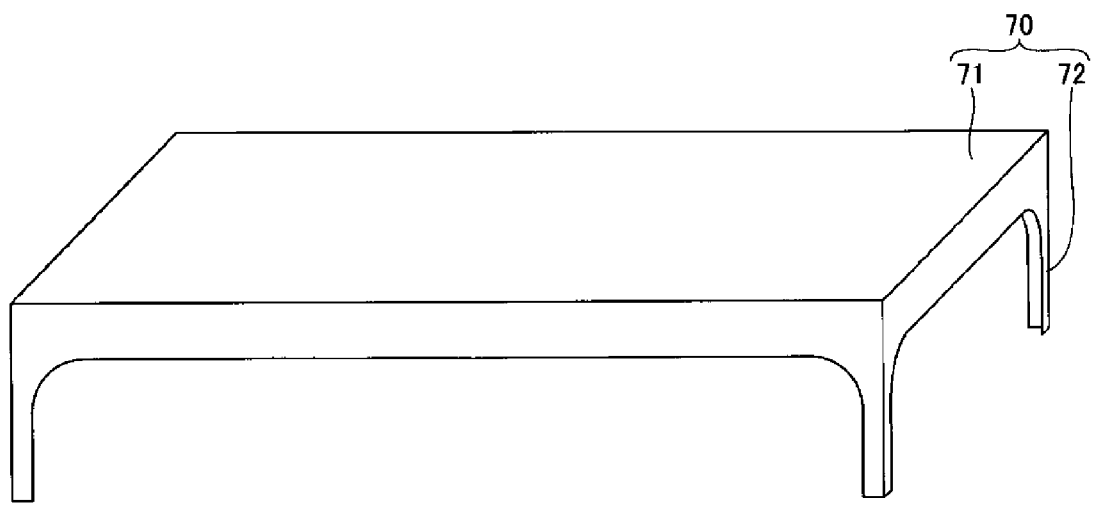
FIG. 5 is a view (part 4) showing the process for manufacturing the semiconductor device according to the first exemplary embodiment.

Next, in a step shown in FIG. 5, a plurality of upper magnetic shield members 70 is prepared. Each upper magnetic shield member 70 includes leg portions 72. The leg portions 72 extend from the four corners of the top plate 71 toward the lower magnetic shield member 20 side. The upper magnetic shield member 70 is made of a metal such as a Fe—Ni based alloy. Therefore, the upper magnetic shield member 70 can be easily formed into a shape shown in FIG. 5 by press working with a die, bending or the like.

Next, in a step shown in FIGS. 6A and 6B, the upper magnetic shield members 70 are provided on the regions, which will become the lower magnetic shield members 20, so that the respective semiconductor chips 40 are disposed between the upper magnetic shield members 70 and the regions. The leg portions 72 of the upper magnetic shield members 70 are press-fitted into the opening portions 20x of the regions, which will become the lower magnetic shield members 20, respectively. Thus, the upper magnetic shield members 70 are in direct contact with the lower magnetic shield members 20, respectively. FIG. 6B is a plan view. FIG. 6A is a sectional view showing one of the regions enclosed by the slits 20z in FIG. 6B.

Next, in a step shown in FIG. 7A, a mold resin 80 is formed on the wiring substrate 10S so as to seal the respective regions, which will become the lower magnetic shield members 20, the semiconductor chips 40 and the upper magnetic shield members 70. For example, an epoxy resin or the like containing fillers such as silica may be used as the mold resin 80. The mold resin 80 may be, for example, formed by a transfer mold method. It is noted that the mold resin 80 may be formed to expose an upper surface of the top plate 71 of the upper magnetic shield member 70.

Next, in a step shown in FIG. 7B, a solder bump 90 is formed, by reflow or the like, on a lower surface of a wiring layer 12 exposed to an opening portion 17x of a solder resist layer 17 in each of regions which will become the wiring substrates 10. After that, the structure shown in FIG. 7B is cut in positions (positions of the slits 20z) of the broken lines defining each region C, by a slicer or the like. Thus, a plurality of semiconductor devices 1 (see FIG. 1) divided individually are obtained.

In this manner, in the semiconductor device 1 according to the first exemplary embodiment, the semiconductor chip 40 is disposed between the upper magnetic shield member 70 and the lower magnetic shield member 20 which are made of the metal with respect to the up and down directions. The upper magnetic shield member 70 and the lower magnetic shield member 20 are in direct contact with each other without intervention of any material (such as a resin) that blocks the flow of magnetism. Accordingly, the flow of magnetism between the upper magnetic shield member 70 and the lower magnetic shield member 20 can be improved so that an external magnetic field is suppressed from affecting the semiconductor chip 40. Particularly, where a soft magnetic material whose magnetic permeability is in the range of about 1,000 to about 10,000 and whose saturated magnetic flux density is in the range of about 0.5 (T) to about 1.5 (T) is used as the material of the upper magnetic shield member 70 and the lower magnetic shield member 20, the above-described advantageous effect is further enhanced.

What material should be selected from the viewpoints of the magnetic permeability and the saturated magnetic flux density depends on the properties of a semiconductor chip to be used. That is, the level of required performance to block an external magnetic field depends on the properties of the semiconductor chip to be used. Therefore, a material having magnetic permeability and saturated magnetic flux density high enough to meet the required performance may be selected. In some required performance, a material having magnetic permeability and saturated magnetic flux density out of the aforementioned range may be selected.

<Second Exemplary Embodiment>

A second exemplary embodiment shows an example in which a lower magnetic shield member and an upper magnetic shield member are connected in a different method from that in the first exemplary embodiment. In the second exemplary embodiment, description may be omitted as to constituent components which are the same as or similar to those in the first exemplary embodiment.

[Structure of Semiconductor Device According to Second Exemplary Embodiment]

Figure 8A:
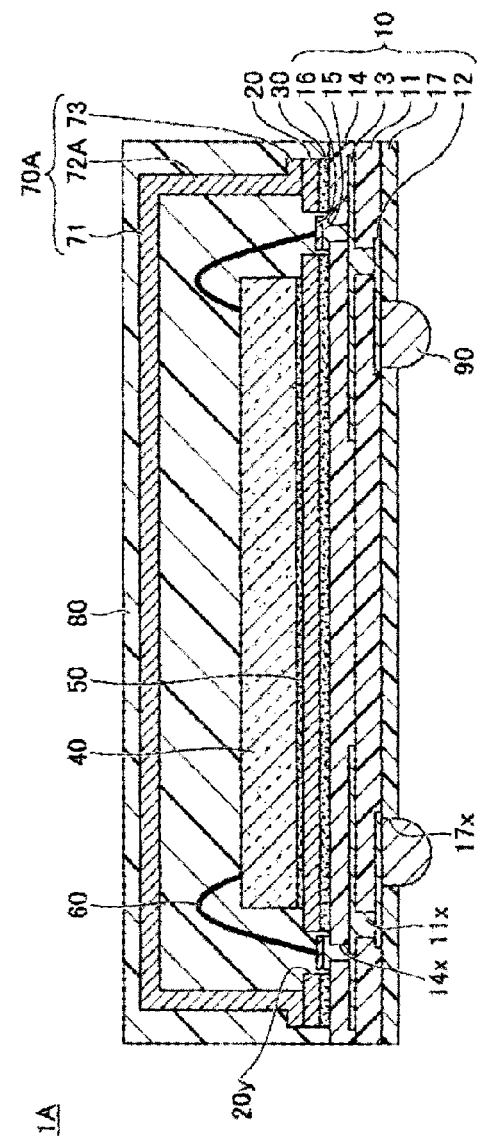
FIGS. 8A and 8B are views showing a semiconductor device according to a second exemplary embodiment.
Figure 8B:
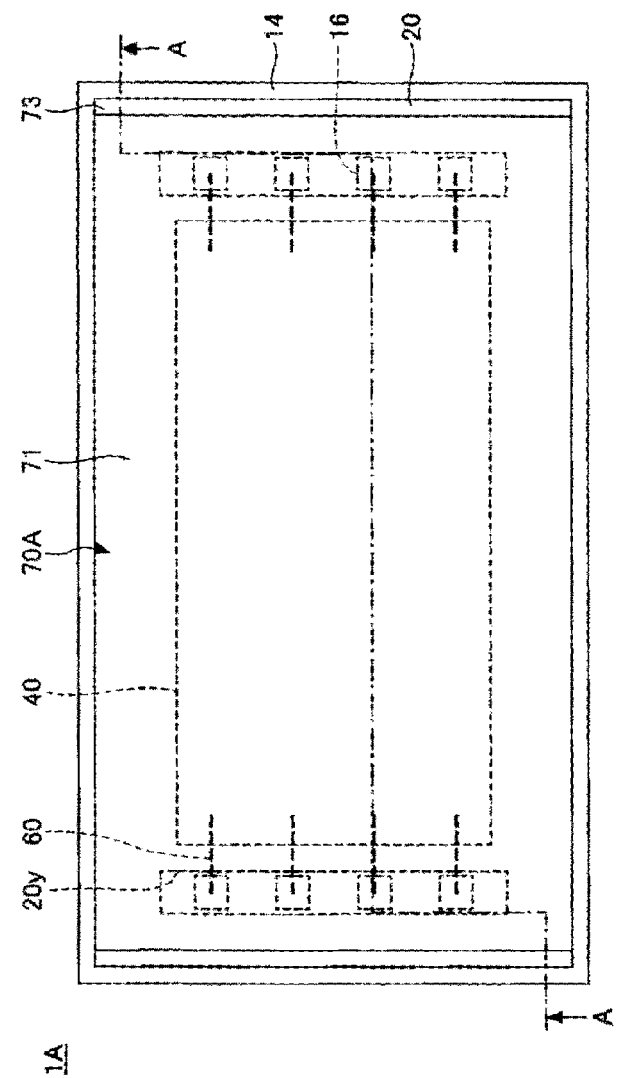

First, the structure of the semiconductor device according to the second exemplary embodiment will be described. FIGS. 8A and 8B are views showing the semiconductor device according to the second exemplary embodiment. FIG. 8B is a plan view. FIG. 8A is a sectional view taken on a line A-A in FIG. 8B. In FIG. 8B, a mold resin 80 is not shown.

Refer to FIGS. 8A and 8B, a semiconductor device 1A is different from the semiconductor device 1 (see FIG. 1) in that the upper magnetic shield member 70 is replaced by an upper magnetic shield member 70A. It is noted that the opening portions 20x are not formed in the lower magnetic shield member 20 of the semiconductor device 1A.

The upper magnetic shield member 70A includes leg portions 72A. The leg portions 72A has plate shapes and extend from two opposed sides (opposed short sides) of a top plate 71 toward the lower magnetic shield member 20. Lower end portions of the leg portions 72A further extend horizontally outward to provide plate-like bending portions 73 (see also FIG. 9 which will be described later). A lower surface of each bending portion 73 is in direct contact with an upper surface (on an outer side of the opening portion 20y) of the lower magnetic shield member 20. That is, the upper magnetic shield member 70A and the lower magnetic shield member 20 are in direct contact with each other.

The lower surface of each bending portion 73 may have, for example, about 1 mm in width. It is noted that the upper magnetic shield member 70A and the lower magnetic shield member 20 are not bonded to each other but are only in contact each other through surfaces thereof. However, the bending portions 73 of the upper magnetic shield member 70A may be bonded to the upper surface of the lower magnetic shield member 20, for example, by resistance welding. A similar material to that of the upper magnetic shield member 70 may be used as the material of the upper magnetic shield member 70A. The upper magnetic shield member 70A has such a shape that the upper magnetic shield member 70A is in contact with neither a semiconductor chip 40 nor bonding wires 60.

In FIG. 8, the lower end portions of the leg portions 72A extend horizontally outward to provide the plate-like bending portions 73. However, the lower end portions of the leg portions 72A may extend horizontally inward to provide plate-like bending portions.

[Method for Manufacturing Semiconductor Device According to Second Exemplary Embodiment]

Figure 9:
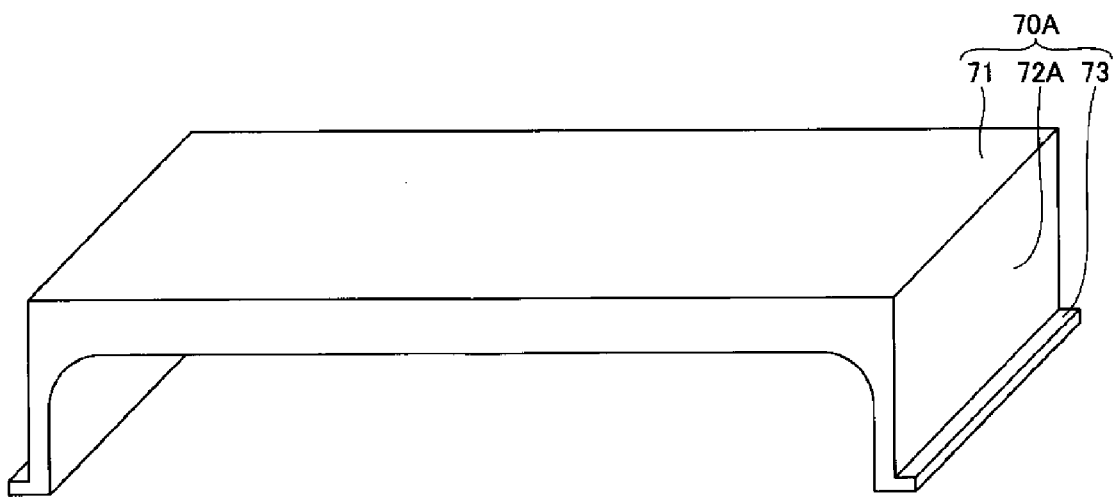
FIG. 9 is a view (part 1) showing a process for manufacturing the semiconductor device according to the second exemplary embodiment.

Next, a method for manufacturing the semiconductor device according to the second exemplary embodiment will be described. FIGS. 9 to 10B show a process for manufacturing the semiconductor device according to the second exemplary embodiment. At first, steps similar to those of FIGS. 2A to 4B in the first exemplary embodiment are carried out (it should be noted that the opening portions 20x are not formed in the lower magnetic shield member 20).

Next, in a step shown in FIG. 9, a plurality of upper magnetic shield members 70A is prepared. Each upper magnetic shield member 70A includes the plate-like leg portions 72A. The leg portions 72A extend from the two opposed sides (opposed short sides) of the top plate 71 toward the lower magnetic shield member 20. The lower end portions of the leg portions 72A further extend horizontally outward to provide the bending portions 73. Each upper magnetic shield member 70A is made of a metal such as a Fe—Ni based alloy. Therefore, the upper magnetic shield member 70A can be easily shaped as shown in FIG. 9 by press working with a die, bending or the like.

Next, in a step shown in FIG. 10A, a wiring substrate 10S is fixed to is fixed onto a lower die 200 of a molding die. The wiring substrate 10S is mounted with a lower magnetic shield member 20S and the semiconductor chips 40. Then, the upper magnetic shield members 70A are disposed on respective regions of the lower magnetic shield member 20S, which will become the lower magnetic shield members 20, so that the semiconductor chips 40 are respectively disposed between the upper magnetic shield members 70A and the regions. On this occasion, it is preferable that positioning holes 20p are formed in the upper magnetic shield members 70A at positions which are further outside the bending portions 73 and that positioning protrusion portions 210 provided in the lower die 200 are fitted into the positioning holes 20p, respectively. Thus, in a step of forming the mold resin 80 as will be described later, the upper magnetic shield members 70A can be prevented from being displaced from the respective regions which will become the lower magnetic shield members 20. The positioning holes 20p may be, for example, provided in the four corners of each upper magnetic shield member 70A.

Next, in a step shown in FIG. 10B, the mold resin 80 is formed on the wiring substrate 10S so as to seal the regions which will become the lower magnetic shield members 20, the semiconductor chips 40 and the upper magnetic shield members 70A in the same manner as in the step shown in FIG. 7A. After that, the solder bumps 90 are formed on the lower surface of the wiring layer 12, which is exposed to the opening portions 17x of the solder resist layer 17 in the respective regions which will become the wiring substrate 10, in the same manner as in the step shown in FIG. 7B. After that, the structure shown in FIG. 10B is cut in positions (positions of slits 20z) of the broken lines defining the regions C, by a slicer or the like. Thus, a plurality of semiconductor devices 1A (see FIG. 8) divided individually are obtained.

In this manner, in the semiconductor device 1A according to the second exemplary embodiment, the upper magnetic shield member 70A and the lower magnetic shield member 20 are in contact with each other through the surfaces thereof. Thus, the contact area between the upper magnetic shield member 70A and the lower magnetic shield member 20 is larger than that in the semiconductor device 1 (see FIGS. 1A, 1B and so on). It is, therefore, possible to further improve the flow of magnetism between the upper magnetic shield member 70A and the lower magnetic shield member 20, as compared with the semiconductor device 1 (see FIGS. 1A, 1B and so on). Thus, an external magnetic field can be further suppressed from affecting the semiconductor chip 40.

<First Modification Example of First Exemplary Embodiment>

A first modification example of the first exemplary embodiment is an example in which a part of the opening portions 20y are integrated with the slits 20z. In the first modification example of the first exemplary embodiment, description may be omitted as to constituent components which are the same as or similar to those in the first and second exemplary embodiments.

FIGS. 11A and 11B show a semiconductor device according to the first modification example of the first exemplary embodiment. FIG. 11B is a plan view. FIG. 11A is a sectional view taken on a line A-A in FIG. 11B. In FIG. 11B, the mold resin 80 is not shown.

Referring to FIGS. 11A and 11B, a semiconductor device 1B is formed with opening portions 20v in place of the opening portions 20y. Each opening portion 20v has a concave shape and is recessed from the outer circumferential edge of the lower magnetic shield member 20 toward the inside of the lower magnetic shield 20 in plan view. In the example of FIGS. 11A and 11B, the opening portions 20v are formed at two left and right positions so as to be opposed to each other. The pads 15 are disposed in the opening portions 20v.

Figure 12A:
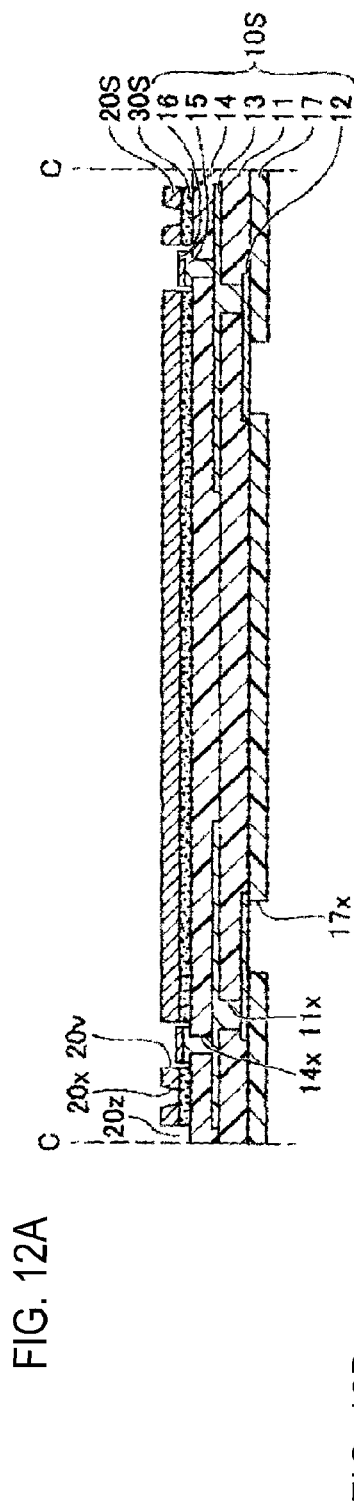
FIGS. 12A and 12B are views showing a process for manufacturing the semiconductor device according to a first modification example of the first exemplary embodiment.
Figure 12B:
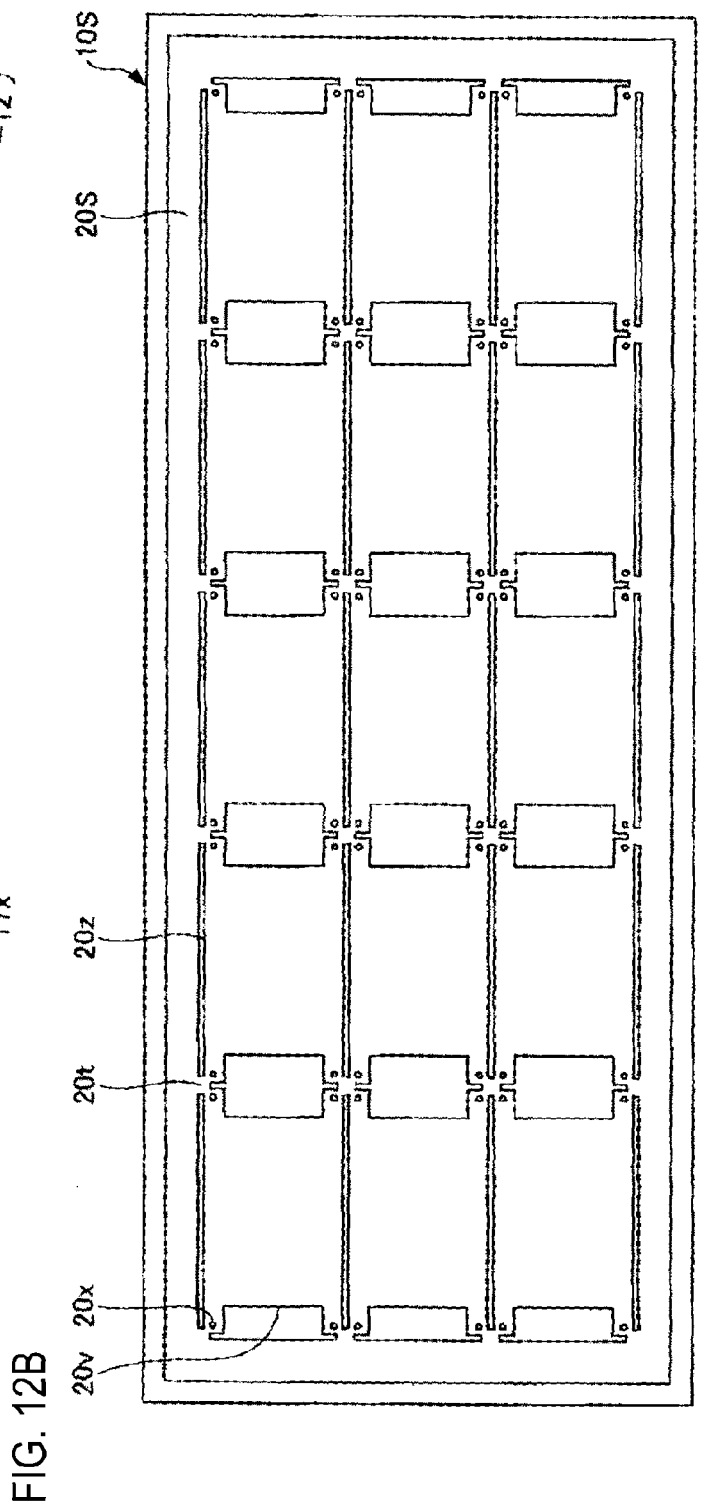

To manufacture the semiconductor device 1B, at first, a step similar to that of FIGS. 2A and 2B in the first exemplary embodiment is carried out. Next, a step similar to that of FIGS. 3A and 3B in the first exemplary embodiment is carried out. However, differently from FIG. 3, the opening portions 20x and 20v and the slits 20z are formed in the sheet-like lower magnetic shield member 20S as shown in FIGS. 12A and 12B. That is, the slits 20z similar to those in FIG. 3 are formed in predetermined positions so as to be substantially parallel to the longitudinal direction of the lower magnetic shield member 20S. Also, the opening portions 20v in which the opening portions 20y and the slits 20z shown in FIG. 3 are integrated are formed in predetermined positions so as to be substantially perpendicular to the longitudinal direction of the lower magnetic shield member 20S.

After that, the step of FIGS. 4A and 4B and the subsequent steps in the first exemplary embodiment are carried out. Thus, the semiconductor device 1B shown in FIGS. 11A and 11B is obtained. The opening portions 20v in which the opening portions 20y for exposing pads and the slits 20z for facilitating singulation are integrated may be provided in this manner.

The opening portions 20v in which the opening portions 20y for exposing pads and the slits 20z for facilitating singulation are integrated may be provided in the second exemplary embodiment.

<Second Modification Example of First Exemplary Embodiment>

A second modification example of the first exemplary embodiment is an example in which the semiconductor chip 40 is connected to the wiring substrate 10 in a flip-chip manner. In the second modification example of the first exemplary embodiment, description may be omitted as to constituent components which are the same as or similar to those in the first and second exemplary embodiments.

Figure 13A:
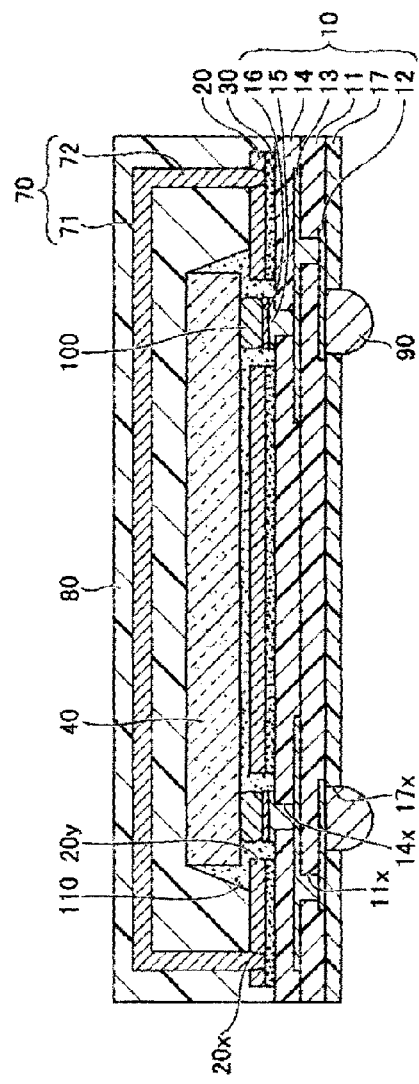
FIGS. 13A and 13B are views showing a semiconductor device according to a second modification example of the first exemplary embodiment.
Figure 13B:
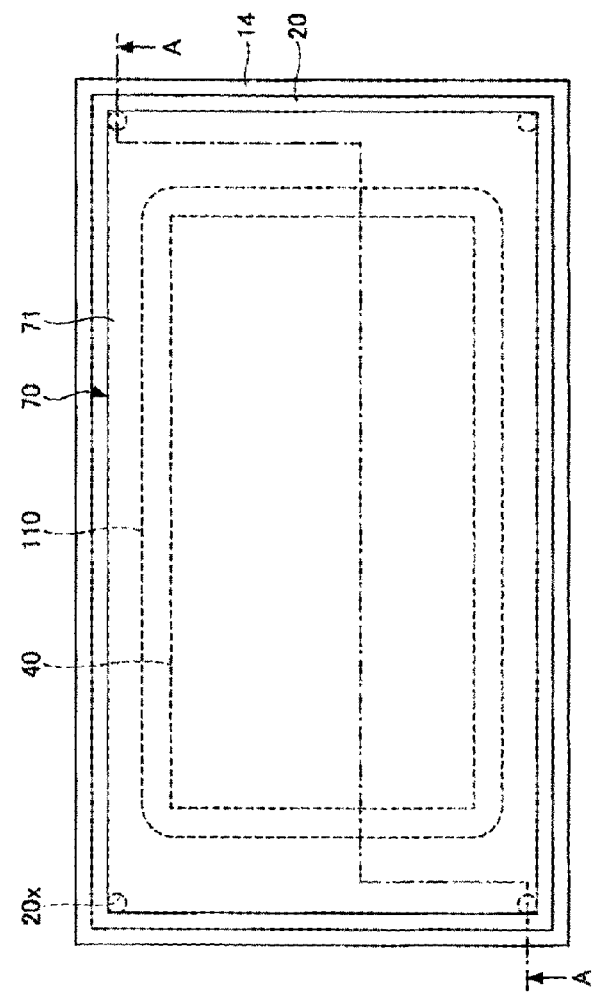

FIGS. 13A and 13B show the semiconductor device 1C according to the second modification example of the first exemplary embodiment. FIG. 13B is a plan view. FIG. 13A is a sectional view taken on a line A-A in FIG. 13B. In FIG. 13B, the mold resin 80 is not shown.

Referring to FIGS. 13A and 13B, in the semiconductor device 1C, the semiconductor chip 40 is connected to the wiring substrate 10 in a flip-chip manner. More specifically, the semiconductor chip 40 is mounted in a face-down manner so that the circuit formation surface of the semiconductor chip 40 where the electrode pads are formed faces the lower magnetic shield member 20. The electrode pads of the semiconductor chip 40 are electrically connected through bumps 100 (such as solder bumps) to the pads 15 exposed to the opening portions 20y of the lower magnetic shield member 20. Each pad 15 has the surface treated layer 16 formed on the upper surface thereof.

An underfill resin 110 is filled between the semiconductor 40 and the lower magnetic shield member 20 so that the bumps 100 are covered by the underfill resin 110. The upper magnetic shield member 70 is provided on the lower magnetic shield member 20 so that the semiconductor chip 40 and the underfill resin 110 are disposed between the upper magnetic shield member 70 and the lower magnetic shield member 20. The upper magnetic shield member 70 and the lower magnetic shield member 20 are in direct contact with each other. The mold resin 80 is provided on the wiring substrate 10 so as to cover the lower magnetic shield member 20, the semiconductor chip 40, the underfill 110 and the upper magnetic shield member 70.

In this manner, in the second modification example of the first exemplary embodiment, the semiconductor chip 40 is connected to the wiring substrate 10 in a flip-chip manner. Also, in this case, in the same manner as in the first exemplary embodiment, the semiconductor chip 40 is disposed between the upper magnetic shield member 70 and the lower magnetic shield member 20 made of a metal with respect to the upper and lower directions. The upper magnetic shield member 70 and the lower magnetic shield member 20 are in direct contact with each other without intervention of any material (such as resin) blocking the flow of magnetism. Therefore, a similar advantageous effect to that in the first exemplary embodiment can be obtained.

In the second exemplary embodiment, the semiconductor chip 40 may be connected to the wiring substrate 10 in a flip-chip manner.

<Third Modification Example of First Exemplary Embodiment>

In a third modification example of the first exemplary embodiment, the upper magnetic shield member is modified. In the third modification example of the first exemplary embodiment, description may be omitted as to constituent components which are the same as or similar to those in the first and second exemplary embodiments.

Figure 14A:
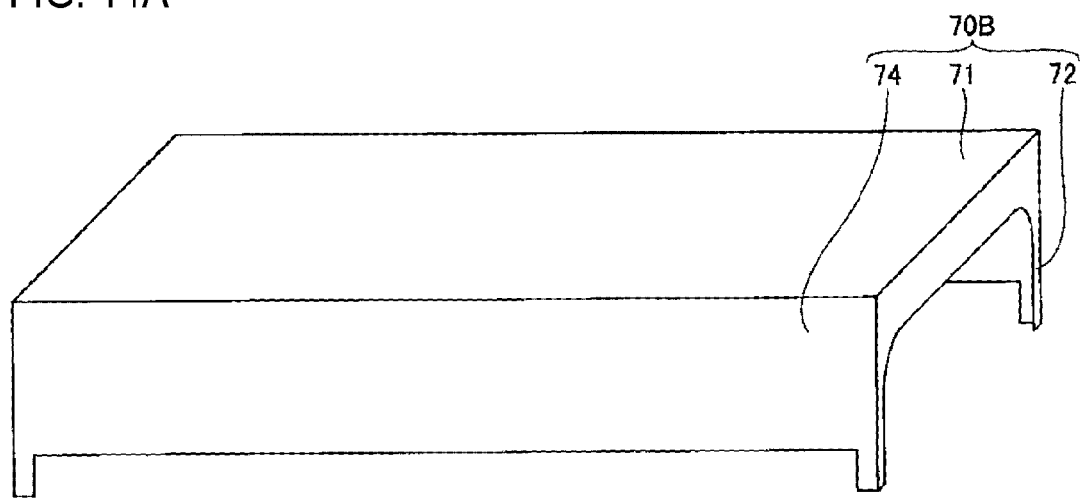
FIGS. 14A and 14B are perspective views showing modification examples of an upper magnetic shield member.
Figure 14B:
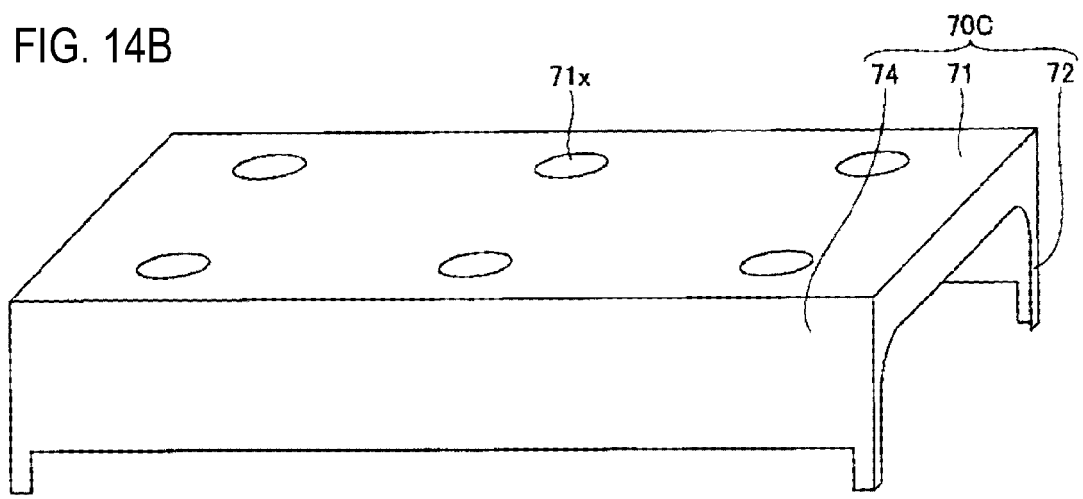

FIGS. 14A and 14B are perspective views showing the upper magnetic shield member according to the third modification example. An upper magnetic shield member 70B shown in FIG. 14A may be used in place of the upper magnetic shield member 70 shown in FIG. 5. The upper magnetic shield member 70B includes plate-like side wall portions 74 extend from two sides (opposed long sides) of the top plate 71 toward the lower magnetic shield member 20. Each side wall portion 74 connects the leg portions 72 adjacent to each other in the longitudinal direction. The side wall portions 74 may be provided in desired portions excluding the distal end portions of the leg portions 72 that will be press-fitted into the opening portions 20x of the lower magnetic shield member 20.

In the case of FIG. 14A, flow of a resin may deteriorate in the step of forming the mold resin 80. Therefore, as shown in FIG. 14B, an upper magnetic shield member 70C in which a plurality of opening portions 71x is formed in the top plate 71 may be used. Alternatively, opening portions may be formed in the side wall portions 74 in place of the top plate 71 or in addition to the top plate 71. In this case, in the step of forming the mold resin 80, the resin flows through the opening portions, and the opening portions are also filled with the resin.

Furthermore, in the upper magnetic shield member 70A shown in FIG. 9, plate-like side wall portions may be provided to extend from two opposed sides (opposed long sides) of the top plate 71 toward the lower magnetic shield member 20. The side wall portions connect the leg portions 72A adjacent to each other in the longitudinal direction, in the same manner as in FIG. 14A. Also, in this case, opening portions may be provided in all of or a part of the top plate 71, the plate-like leg portions 72A and the plate-like side wall portions in order to prevent flow of resin from deteriorating.

In this manner, the upper magnetic shield member may have any shape so long as the upper magnetic shield member is in direct contact with the lower magnetic shield member and a mold resin can flow into the upper magnetic shield member when the upper magnetic shield member is provided on the lower magnetic shield member so that the semiconductor chip is disposed therebetween.

[Clauses]

This disclosure further encompasses various exemplary embodiments, for example, described below.

(1) A method for manufacturing a semiconductor device, the method comprising:

providing a lower magnetic shield member on a wiring substrate, the lower magnetic shield member being made of a metal;

mounting a semiconductor chip on the lower magnetic shield member, the semiconductor chip including a magnetic memory element; and providing an upper magnetic shield member over the semiconductor chip so that the semiconductor chip is disposed between the upper magnetic shield member and the lower magnetic shield member, the upper magnetic shield member being made of the metal, wherein the providing the upper magnetic shield member provides the upper magnetic shield member so that the lower magnetic shield member and the upper magnetic shield member are in direct contact with each other.

The exemplary embodiments have been described above. It should be noted that the invention is not limited thereto. Various modifications and replacements may be made in the above described exemplary embodiments without departing from the scope of claims.

What is claimed is:

1. A semiconductor device comprising:
  a wiring substrate;
  a lower magnetic shield member that is provided on the wiring substrate;
  a semiconductor chip that is provided on the lower magnetic shield member, the semiconductor chip including a magnetic memory element; and
  an upper magnetic shield member that is provided over the semiconductor chip, the semiconductor chip being disposed between the upper magnetic shield member and the lower magnetic shield member,
  wherein
  the lower magnetic shield member and the upper magnetic shield member are in direct contact with each other,
  the upper magnetic shield member comprises
    a top plate opposite to the lower magnetic shield member across the semiconductor chip, and leg portions extending from the top plate toward the lower magnetic shield member, and the lower magnetic shield member is in direct contact with the leg portions.

2. The semiconductor device of claim 1, wherein
the upper magnetic shield member further comprises bending portions,
each leg portion has a plate shape,
the leg portions extend from two opposed sides of the top plate toward the lower magnetic shield member,
each bending portion has a plate shape,
the bending portions horizontally extend from lower end portions of the leg portions, and
lower surfaces of the bending portions are in direct contact with an upper surface of the lower magnetic shield member.

3. The semiconductor device of claim 1, wherein
plural holes are formed in the lower magnetic shield member, and
lower end portions of the leg portions are press-fitted into the holes, respectively.

4. The semiconductor device of claim 1, wherein a resin is provided between the lower magnetic shield member and the upper magnetic shield member so as to cover the semiconductor chip.

5. The semiconductor device of claim 4, wherein the resin seals the lower magnetic shield member and the upper magnetic shield member with a portion of the resin provided between the lower magnetic shield member and the upper magnetic shield member.

6. The semiconductor device of claim 5, wherein
opening portions are formed in the upper magnetic shield member, and
the resin is filled in the opening portions of the upper magnetic shield member.

7. The semiconductor device of claim 1, wherein the upper magnetic shield member and the lower magnetic shield member include a soft magnetic material.

8. The semiconductor device of claim 1, wherein each of the upper magnetic shield member and the lower magnetic shield member consists of a soft magnetic material.

9. The semiconductor device of claim 1, wherein
opening portions are formed in the lower magnetic shield member so as to expose pads of the wiring substrate, and
each opening portion is recessed from a corresponding outer circumferential edge of the lower magnetic shield member toward an inside of the lower magnetic shield, in plan view.

10. A semiconductor device comprising:
a wiring substrate;
a lower magnetic shield member that is provided on the wiring substrate;
a semiconductor chip that is provided on the lower magnetic shield member, the semiconductor chip including a magnetic memory element; and
an upper magnetic shield member that is provided over the semiconductor chip, the semiconductor chip being disposed between the upper magnetic shield member and the lower magnetic shield member,
wherein
the lower magnetic shield member and the upper magnetic shield member are in direct contact with each other,
the semiconductor chip is provided on the lower magnetic shield member so that electrode pads of the semiconductor chip face the upper magnetic shield member,
opening portions are formed in the lower magnetic shield member so as to expose pads of the wiring substrate, and
the electrode pads of the semiconductor chip and the pads of the wiring substrate are electrically connected to each other through metal wires, respectively.

11. The semiconductor device of claim 10, wherein
the upper magnetic shield member comprises
a top plate opposite to the lower magnetic shield member across the semiconductor chip, and
leg portions extending from the top plate toward the lower magnetic shield member, and
the lower magnetic shield member is in direct contact with the leg portions.

12. The semiconductor device of claim 11, wherein
the upper magnetic shield member further comprises bending portions,
each leg portion has a plate shape,
the leg portions extend from two opposed sides of the top plate toward the lower magnetic shield member,
each bending portion has a plate shape,
the bending portions horizontally extend from lower end portions of the leg portions, and
lower surfaces of the bending portions are in direct contact with an upper surface of the lower magnetic shield member.

13. The semiconductor device of claim 11, wherein
plural holes are formed in the lower magnetic shield member, and
lower end portions of the leg portions are press-fitted into the holes, respectively.

14. The semiconductor device of claim 10, wherein a resin is provided between the lower magnetic shield member and the upper magnetic shield member so as to cover the semiconductor chip.

15. The semiconductor device of claim 14, wherein the resin seals the lower magnetic shield member and the upper magnetic shield member with a portion of the resin provided between the lower magnetic shield member and the upper magnetic shield member.

16. The semiconductor device of claim 15, wherein
opening portions are formed in the upper magnetic shield member, and
the resin is filled in the opening portions of the upper magnetic shield member.

17. The semiconductor device of claim 10, wherein the upper magnetic shield member and the lower magnetic shield member include a soft magnetic material.

18. The semiconductor device of claim 10, wherein each of the upper magnetic shield member and the lower magnetic shield member consists of a soft magnetic material.

19. The semiconductor device of claim 10, wherein
each opening portion is recessed from a corresponding outer circumferential edge of the lower magnetic shield member toward an inside of the lower magnetic shield member, in plan view.

20. A semiconductor device comprising:
a wiring substrate;
a lower magnetic shield member that is provided on the wiring substrate;
a semiconductor chip that is provided on the lower magnetic shield member, the semiconductor chip including a magnetic memory element;
an upper magnetic shield member that is provided over the semiconductor chip, the semiconductor chip being disposed between the upper magnetic shield member and the lower magnetic shield member;

an underfill resin that is provided between the semiconductor chip and the lower magnetic shield member,
wherein
the lower magnetic shield member and the upper magnetic shield member are in direct contact with each other,
the semiconductor chip comprises
a first surface that faces the wiring substrate, and
a second surface that is opposite from the first surface,
the second surface of the semiconductor chip is covered by the upper magnetic shield member,
electrode pads of the semiconductor chip face the lower magnetic shield member,
opening portions are formed in the lower magnetic shield member so as to expose pads of the wiring substrate, and
the electrode pads of the semiconductor chip and the pads of the wiring substrate are electrically connected to each other through bumps.

21. The semiconductor device of claim 20, wherein
the upper magnetic shield member comprises
a top plate opposite to the lower magnetic shield member across the semiconductor chip, and
leg portions extending from the top plate toward the lower magnetic shield member, and
the lower magnetic shield member is in direct contact with the leg portions.

22. The semiconductor device of claim 21, wherein
the upper magnetic shield member further comprises bending portions,
each leg portion has a plate shape,
the leg portions extend from two opposed sides of the top plate toward the lower magnetic shield member,
each bending portion has a plate shape,
the bending portions horizontally extend from lower end portions of the leg portions, and
lower surfaces of the bending portions are in direct contact with an upper surface of the lower magnetic shield member.

23. The semiconductor device of claim 21, wherein
plural holes are formed in the lower magnetic shield member, and
lower end portions of the leg portions are press-fitted into the holes, respectively.

24. The semiconductor device of claim 20, wherein a resin is provided between the lower magnetic shield member and the upper magnetic shield member so as to cover the semiconductor chip.

25. The semiconductor device of claim 24, wherein the resin seals the lower magnetic shield member and the upper magnetic shield member with a portion of the resin provided between the lower magnetic shield member and the upper magnetic shield member.

26. The semiconductor device of claim 25, wherein
opening portions are formed in the upper magnetic shield member, and
the resin is filled in the opening portions of the upper magnetic shield member.

27. The semiconductor device of claim 20, wherein the upper magnetic shield member and the lower magnetic shield member include a soft magnetic material.

28. The semiconductor device of claim 20, wherein each of the upper magnetic shield member and the lower magnetic shield member consists of a soft magnetic material.

29. The semiconductor device of claim 20, wherein
each opening portion is recessed from a corresponding outer circumferential edge of the lower magnetic shield member toward an inside of the lower magnetic shield member, in plan view.

* * * * *